US005565785A

United States Patent [19]

Rodgers et al.

[11] Patent Number: 5,565,785

[45] Date of Patent: Oct. 15, 1996

[54] POTENTIOMETER CALIBRATION METHOD

[75] Inventors: Barry Rodgers; Stanley H. Edwards; Timothy B. Phillips, all of Raleigh, N.C.

[73] Assignee: Square D Company, Palatine, Ill.

[21] Appl. No.: 342,191

[22] Filed: Nov. 18, 1994

[51] Int. Cl.$^6$ .................................................. G01R 35/00

[52] U.S. Cl. ............................ 324/601; 324/714; 338/89; 338/196

[58] Field of Search .................................... 324/601, 691, 324/714, 723; 338/89, 135, 196

[56] References Cited

U.S. PATENT DOCUMENTS

| | | | |
|---|---|---|---|
| 3,377,555 | 4/1968 | Lewis | 324/723 |
| 3,427,537 | 2/1969 | Osborne | 324/714 |
| 3,579,107 | 5/1971 | Butterhoff | 324/157 |
| 3,588,780 | 6/1971 | Takimoto | 338/196 |
| 3,593,137 | 7/1971 | Wall | 324/157 |
| 3,597,717 | 8/1971 | Kent | 338/131 |
| 3,609,543 | 9/1971 | Whitmore | 324/123 R |
| 3,990,066 | 11/1976 | Malmgren | 324/694 X |
| 4,377,346 | 3/1983 | Beaver et al. | 338/135 X |
| 4,931,710 | 6/1990 | DeVara et al. | 338/184 X |

*Primary Examiner*—Kenneth A. Wieder
*Assistant Examiner*—Glenn W. Brown
*Attorney, Agent, or Firm*—David Russell Stacey; Larry T. Shrout; Larry I. Golden

[57] ABSTRACT

A calibration method for a potentiometer which provides indicia reflecting an accurate indication of actual electrical resistance throughout the resistive range of a particular potentiometer. The indicia includes a number of graduation marks or symbols having a range and spacing unique to the resistive characteristics of the particular potentiometer. The indicia is fixed with respect to a known location associated with the particular potentiometer. The range and spacing of the indicia graduations is derived from measured resistance values at predetermined locations along the resistive member of the particular potentiometer.

14 Claims, 4 Drawing Sheets

| PRESELECTED MAXIMUM RESISTANCE RANGE | INDEX NUMBER |
|---|---|
| 95000-96000 | 1 |
| 96000.1-98000 | 2 |
| 98000.1-100000 | 3 |
| 100000.1-102000 | 4 |
| 102000.1-104000 | 5 |
| 104000.1-105000 | 6 |

| ELEC_ANGLE RANGE | INDEX NUMBER |
|---|---|
| 200-208 | 1 |
| 208.1-216 | 2 |
| 216.1-224 | 3 |
| 224.1-232 | 4 |
| 232.1-240 | 5 |

POTENTIOMETER CALIBRATION METHOD

FIELD OF THE INVENTION

The present invention relates to the field of electronic circuits components and particularly to potentiometers and a method for calibrating individual potentiometers.

BACKGROUND OF THE INVENTION

It is common to use a potentiometer to vary the electrical resistance at a particular point in an electric circuit over a range determined by the potentiometer. It is common knowledge that potentiometers are made from an electrically resistive material generally having a connection point at each end thus providing a fixed electrical resistance between the two ends. A "wiper" which is slidably movable between the two ends and also includes a connection point provides a selectively variable resistance ranging from approximately zero to the full resistance of the potentiometer. Potentiometers are generally designated by their maximum electrical resistance, such as 1K, 5K, 10K, 100K ohms, etc. Potentiometers are further designated by tolerance ranges such as ±20%, ±10%, ±5% or ±1%. It is obviously less expensive to produce a potentiometer having a ±20% tolerance than to produce a potentiometer having a ±5% tolerance. It is also common for the linearity of the resistance to vary over the length of the resistive material used in the potentiometer such that equal movements of the wiper do not always produce equal changes in resistance. Each potentiometer, regardless of its manufacturing technique, stated tolerance and quality control, has individual characteristics with respect to its maximum electrical resistance, linearity and with respect to the arc or length of travel of the wiper between its maximum and minimum resistance. In many applications the potentiometer is used to provide a variable electrical resistance that is critical to the proper operation of the electrical circuit in which it is installed. The potentiometer is generally provided with a pointer or indicator which provides an indication of the relative position of the wiper with respect to the resistive material of the potentiometer. The indicator interfaces with an indicia in the form of numbers, letters or graduation marks on a plate in fixed relationship with the potentiometer. This interface provides a relative indication of the electrical resistance at the wiper connection and thereby the resistance of the potentiometer. It is generally understood that varying the potentiometer resistance changes the output or function of the circuit in which it is installed. Therefore, in situations where the electrical resistance of the potentiometer is critical to the performance of the circuit, the interface relationship between the indicator and the indicia must accurately indicate the true electrical resistance of the potentiometer or the true circuit function. This can require further calibration of the potentiometer. Calibration is generally accomplished by adding a fixed value resistor, a laser trimmable resistor, a manually adjustable trimmer resistor or other form of selectively variable resistance in series with the potentiometer. The trimmer resistor is then manually adjusted such that the potentiometer resistance is calibrated to the desired value with respect to the interface between the indicator and indicia. However, a trimming resistor can only adjust the potentiometer value at one point and can not adjust for nonlinearity of the resistive material. These calibration methods generally require access to the printed circuit board on which the fixed resistor or trimmer resistor are attached after the device is fully assembled or at least after the indicia is in its final relationship with the potentiometer indicator. These methods of calibration also add both material and labor cost to the device being manufactured. It is therefore desirable to provide a fast, accurate and inexpensive method of calibrating each individual potentiometer with respect to its associated indicator and indicia without adding any additional electrical components to the electrical circuit or requiring access to the circuit boards enclosed within the device after assembly has been completed. It would also be desirable to calibrate a low cost potentiometer having a tolerance of ±20% for use in situations where a more expensive potentiometer having a tolerance of ±5% or less is required, or to correct nonlinearity of the resistive material throughout the potentiometer resistance range. It would also be desirable to calibrate potentiometer such that any number of desired circuit outputs or functions are accurately indicated by the interface between the indicator and the indicia.

SUMMARY OF THE INVENTION

The present invention discloses a method of calibrating each potentiometer individually with respect to the interface between an associated indicator and an associated indicia. The indicator is in fixed relationship with a wiper and the indicia is in fixed relationship with the potentiometer. This calibration method is unique to each potentiometer and is accomplished without requiring any additional electronic potentiometer circuit components, assembly labor or access to internal electrical components after assembly is completed. The calibration method involves measuring the resistance of the potentiometer at its extreme positions and at preselected positions of the wiper between the extreme positions when a preselected voltage is applied to the potentiometer. Each measured resistance value is compared to a group of preselected resistance value ranges associated with the preselected position of the wiper of that measured resistance value. An index number is assigned to the measured value depending on which of the preselected resistance value ranges that measured value falls within. The index numbers are used to calculate the beginning, ending and intermediate graduation mark locations or numeral positions for the indicia associated with that particular potentiometer. The calculated indicia is then applied to a plate which is attached to the potentiometer or the housing enclosing the potentiometer. The plate is in fixed relationship with a known location on the potentiometer or a known position of the potentiometer within the housing. The indicator, being in fixed relationship with the wiper thereby provides an accurate and individually calibrated indication of the resistance of that particular potentiometer without requiring additional electronic components or adjustments. This method can also be used to calibrate a particular circuit function controlled by the potentiometer by measuring critical circuit values controlled by that potentiometer and using the index numbers determined by those measured values to determine the indicia graduation placement and thereby the accurate calibration of that particular potentiometer to its associated circuit functions.

Other features and advantages of the invention will become apparent to those skilled in the art upon review of the following detailed description, claims and drawings.

Figure 1:
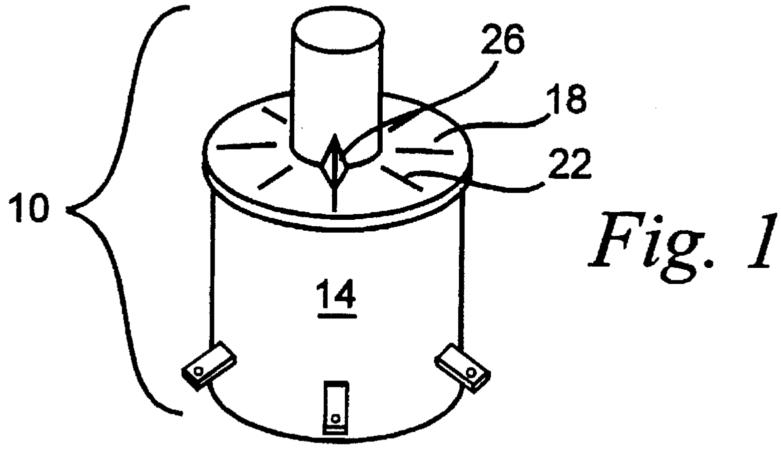
FIG. 1 is an isometric view of a potentiometer with an indicator attached to the control shaft and calibration indicia on a plate assembled in a fixed relation to a known location on the potentiometer.

Before one embodiment of the invention is explained in detail, it is to be understood that the invention is not limited in its application to the details of construction and description or illustrated in the drawings. The invention is capable of other embodiments and of being practiced or being carried out in various other ways. Also, it is to be understood that the phraseology and terminology used herein is for the purpose of description and should not be regarded as limiting.

DESCRIPTION OF THE PREFERRED EMBODIMENT

FIG. 1 illustrates a potentiometer assembly generally indicated by reference numeral 10. The assembly 10 includes a potentiometer 14, a plate 18 on which indicia 22 has been placed, and an indicator 26 for pointing to the indicia 22 as a general indication of the resistance value to which the potentiometer 14 has been adjusted.

Figure 2:
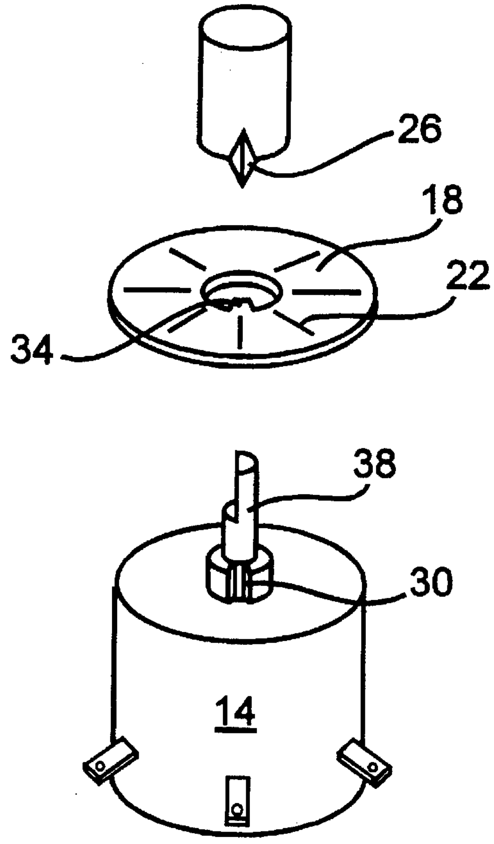
FIG. 2 is an exploded view of the potentiometer of FIG. 1.

FIG. 2 is an exploded view of the assembly 10. As can be clearly seen, the plate 18 includes a method of orienting its position with respect to the potentiometer 14. This method can be a slot 30 in a portion of the potentiometer 14 which corresponds with a tab 34 on the plate 18 or any similar method such as an alignment pin and hole or various corresponding flat surfaces or irregular shapes located on the potentiometer 14 and plate 18 as long as the plate 18 when installed is maintained in a known fixed relationship with the potentiometer 14. The potentiometer 14 also includes a control shaft 38 attached to a wiper inside the potentiometer 14. The control shaft 38 is selectively rotatable between a full clockwise position and a full counter clockwise position. In moving between these two positions the wiper slidingly engages a resistive element, also inside the potentiometer 14, and thereby varies the electrical resistance between a selected end of the resistive element and the wiper. The indicator 26 is attached to the control shaft 38 such that it maintains a known fixed relationship with the wiper. The method of maintaining the fixed relationship between the indicator 26 and wiper can be similar to any of the methods described above for maintaining the fixed relationship between the plate 18 and potentiometer 14.

Figure 3:
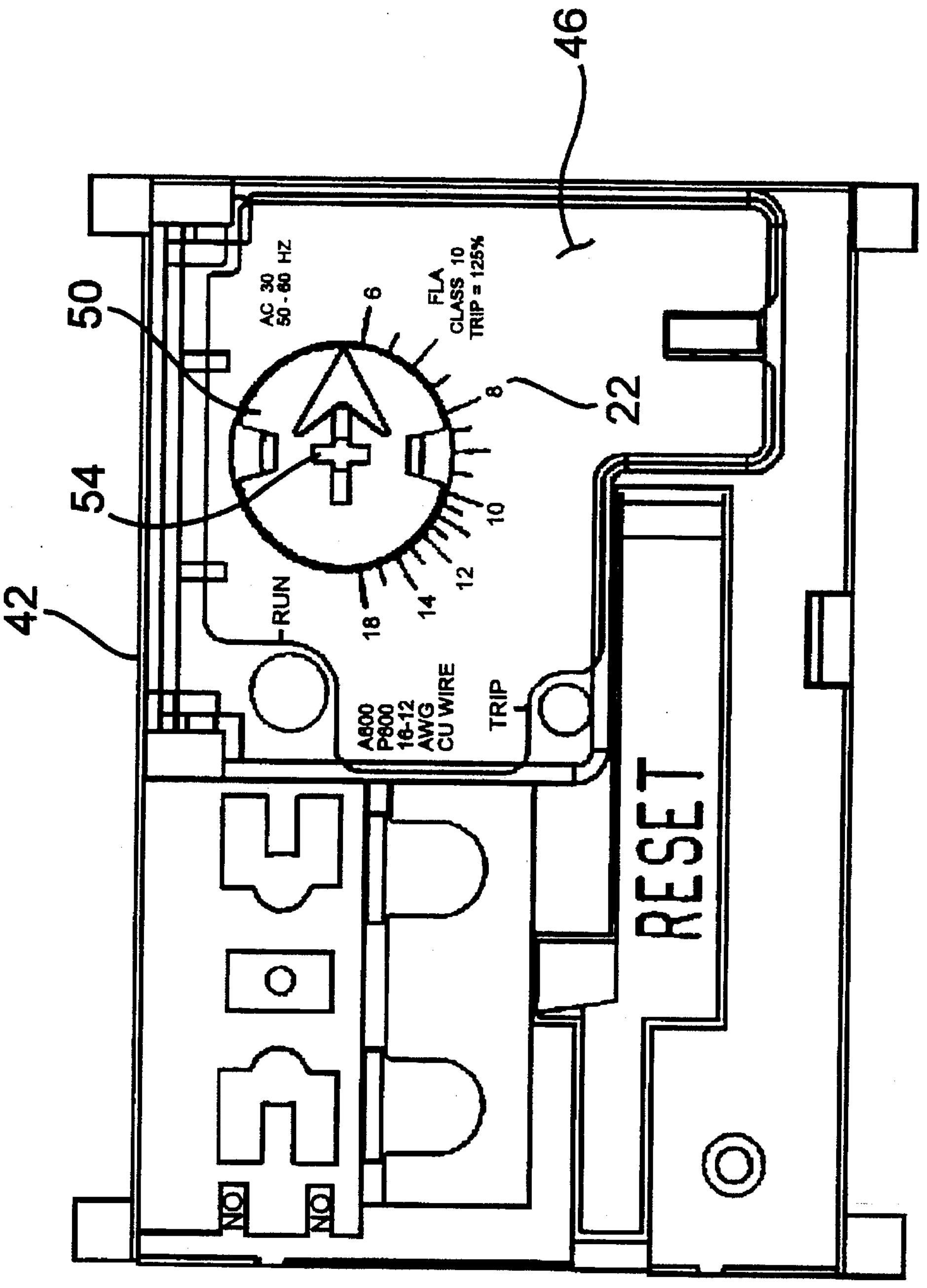
FIG. 3 is a top view of a housing enclosing a potentiometer illustrating a calibrated indicia label attached to the housing and the potentiometer indicator.

FIG. 3 illustrates an embodiment wherein the potentiometer 14 is enclosed within a housing 42 and the indicia 22 is placed on a label 46 after the label 46 has been fixedly attached to the housing 42. An indicator/knob 50 is attached to the control shaft 38 of the potentiometer 14. This process requires that the potentiometer 14 be held in a known fixed relationship to the housing 42. The housing 42 is held securely in a particular orientation with a laser label printing device which burns the indicia 22 onto the label 46. The laser is properly aligned over the label 46 by locating on a cross 54 at the center of the indicator/knob 50. Other accurate printing or marking devices can be used to mark the indicia 22 on the label 46.

Figures 4, 5:
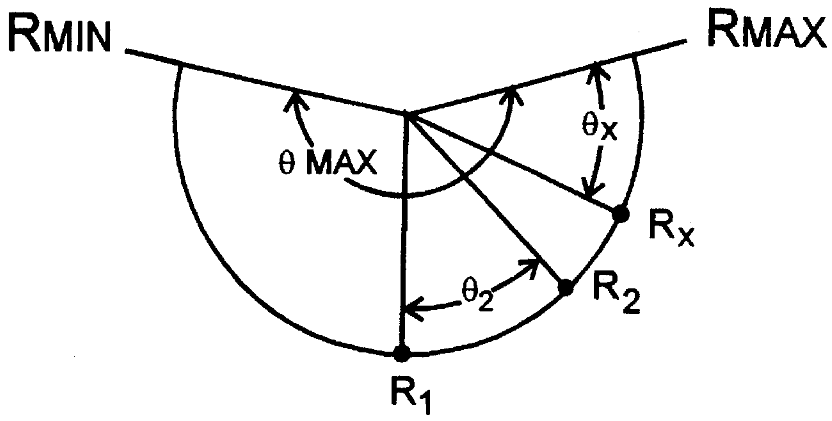
FIG. 4 is a graphical illustration of the electrical angle of a potentiometer.
FIG. 5 is a typical example of preselected maximum resistance ranges and their associated index numbers associated with a 100K ±5% potentiometer.
Figures 6, 7:
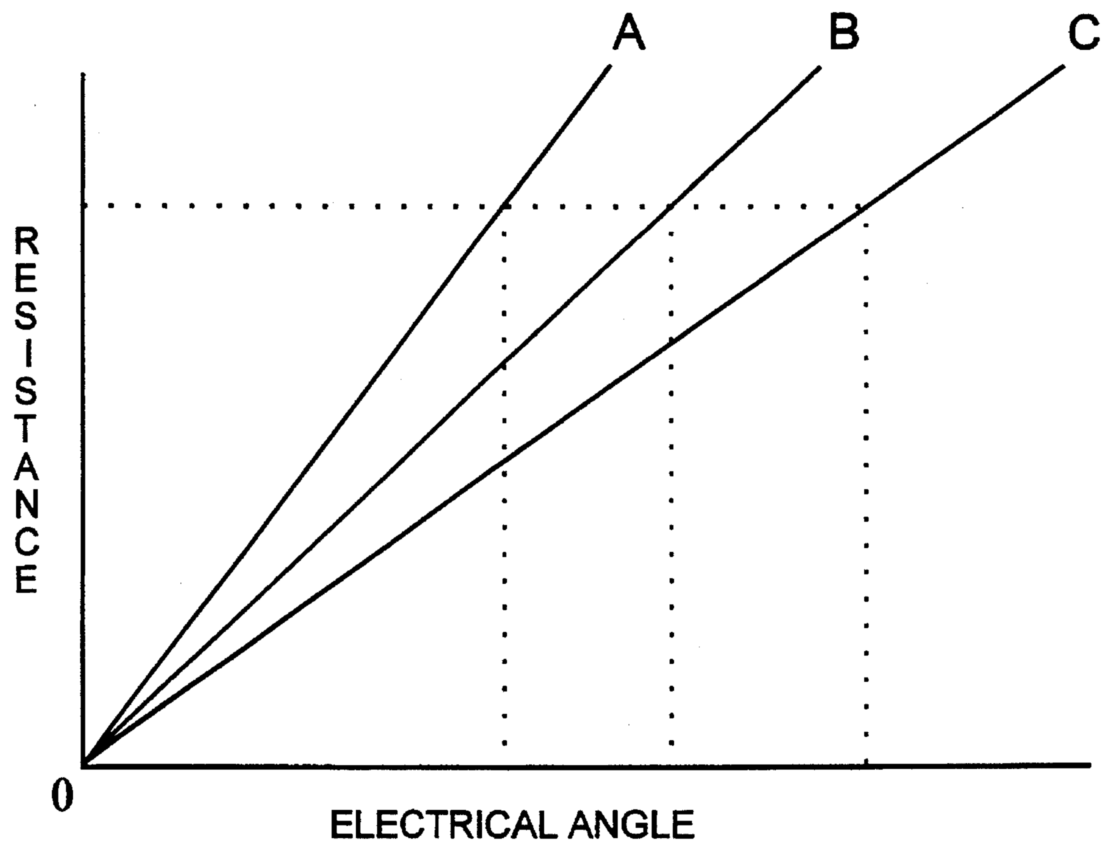
FIG. 6 is a typical example of preselected electrical angle ranges and their associated index numbers.
FIG. 7 is a graph comparing the potentiometer resistance to control shaft rotation angle for three hypothetical potentiometers having the same published resistance value range.

In accordance with the present invention, the method of accurately calibrating an individual potentiometer 14 includes the steps of measuring the maximum resistance ($R_{max}$) of the potentiometer 14, the resistance at predetermined locations of the wiper, for example halfway between the maximum clockwise position and the maximum counter clockwise position ($R_1$) and a resistance $R_2$ at some known angle, $Theta_2$, from $R_1$. The maximum electrical angle ($Theta_{max}$) of the potentiometer can be calculated from these reading by using the following formula: $Theta_{max}= Theta_2 \times R_{max}/((R_{max}/2)-R_2)$. An electrical angle and elements of the formula are graphically illustrated in FIG. 4. Referring now to FIG. 5, the maximum resistance $R_{max}$ is compared with a group of resistance ranges and assigned an index number depending on which of the preselected resistance value ranges that measured value falls within. Referring now to FIG. 6, the maximum electrical angle is compared with a group of preselected electrical angle ranges and assigned an index number depending on which of the preselected electrical angle ranges that calculated or measured maximum electrical angle falls within. These index numbers are used to indicate a particular range and spacing for the indicia graduations which will be printed on the plate 18 or label 46 by the printing device. The index number corresponding to the maximum electrical angle determines the range of the indicia 22 while the index number or numbers associated with the measured resistance determines the spacing for the indicia graduations. For purposes of this description, "electrical angle" is defined as the angle of rotation of the control shaft of a rotary operated potentiometer between positions corresponding to two specified values of resistance of the potentiometer.

By using this same method additional resistance measurement can be made at other predetermined wiper positions to increase the accuracy of the potentiometer calibration and adjust for nonlinearity in the resistive material of the potentiometer 14.

It is desirable to place the index numbers on a machine readable bar code label attached to the device. This permits the indicia 22 to be applied as an operation of an automated assembly process which reads and interprets the index numbers. It also provides a means of recording the individual resistive characteristics of a particular potentiometer permanently on the potentiometer or its housing.

FIG. 7 illustrates how three 100K±5% off-the-shelf potentiometers A, B and C can differ with respect to the electrical angle at a specified resistance. The potentiometer calibration method of the present invention provides individual calibration such that, at a specified resistance value, the indicator of each of the potentiometers A, B and C would point to the same indicia graduation regardless of the difference in electrical angle.

In another embodiment of the calibration method of the present invention, the actual measured values of a particular potentiometer are used to provide an individual indicia range and graduation spacing for that particular potentiometer. In this method the maximum resistance ($R_{max}$) of the potentiometer 14, the resistance at predetermined locations of the wiper, for example halfway between the maximum clockwise position and the maximum counter clockwise position ($R_1$) and a resistance $R_2$ at some known angle, $Theta_2$, from $R_1$ are measured. The electrical angle ($Theta_{max}$) of the potentiometer can be accurately calculated from these readings by using the following formula: $Theta_{max}$ $Theta=Theta_2 \times R_{max}/((R_{max}/2)-R_2)$. Using the electrical angle ($Theta_{max}$) as a reference point, the angle ($Theta_x$) for any particular resistance ($R_x$) can be subtracted from $Theta_{max}$ to produce an accurate indicia location for that particular $R_x$. $Theta_x$ can be calculated by using the following formula: $Theta_x=(Theta_{max}/2)+((R_1-R_x)\times(Theta_{max}/R_{max}))$. An electrical angle and elements of the formula are graphically illustrated in FIG. 4.

The calibration method of the present invention, in its most precise mode, uses the actual measured values of a particular potentiometer directly to provide an individual indicia range and graduation spacing for that particular potentiometer. In this method, the plate 18 is placed in a fixture such that it is in fixed relationship with the printing/marking machine. The potentiometer 14 is connected to a resistance measuring device such that as the control shaft 38 is rotated throughout its range the resistance at the wiper can be continuously measured. The printing/marking device is indexed with the control shaft 38 such that movement of the control shaft 38 produces a corresponding movement of the printing/marking device. As the control shaft 38 is rotated to positions wherein desired resistance readings are indicated by the resistance measuring device, the printing/marking device is activated thereby causing a desired indicia marking to be produced on the plate 18 at a particular position corresponding to that particular position of the control shaft 38. This method can also be used for a potentiometer enclosed within a housing.

When it is desired to calibrate the potentiometer 14 such that the indicia 22 indicates a specific output or function of the electrical circuit, electrical measurements such as resistance or voltage can be taken at specified test points controlled by the particular potentiometer and processed as described in any of the embodiments above. The calibrated indicia 22 derived from the electrical measurements provides an accurate indication of the output or function of the circuit at various positions of the potentiometer control shaft 38.

While a preferred embodiment has been shown and described, it will be understood that it is not intended to limit the disclosure, but rather it is intended to cover all modifications and alternate methods falling within the spirit and the scope of the invention as defined in the appended claims. For example, it will be understood by those skilled in the art that, while the above description relates to using a method for calibrating a rotary operated potentiometer, the present invention can be used in the calibration of a linear operated potentiometer by substituting the linear displacement of the potentiometer control lever for the electrical angle of the rotary operated potentiometer described above.

We claim:

1. A method of calibrating a potentiometer having minimum and maximum resistance values corresponding to opposing end-of-travel positions of a wiper and selectable resistance values corresponding to said wiper being positioned at selected positions between said opposing end-of-travel positions, comprising the steps of:

measuring the maximum resistance value of said potentiometer;

measuring a first resistance value at a first predetermined position of the wiper;

measuring a second resistance value at a second predetermined position of the wiper wherein a measure of the displacement between said first and second predetermined positions is known;

comparing said measured maximum resistance value with a plurality of preselected resistance ranges associated with said maximum resistance value;

assigning a range index number associated with that one of said plurality of preselected resistance ranges in which said measured maximum resistance value falls;

calculating a maximum displacement of said wiper using said measured maximum resistance value, said first and second measured resistance values and said known measure of displacement between said first and second positions;

comparing said calculated maximum displacement with a plurality of preselected displacement ranges associated with said calculated maximum displacement;

assigning a displacement index number associated with that one of said plurality of preselected displacement ranges in which said calculated maximum displacement falls;

determining a range and a spacing interval for a plurality of indicia graduation marks based on said range and displacement index numbers, said indicia graduation marks indicating a calibrated resistance of said potentiometer with respect to a particular displacement of the wiper from one of said opposing end-of-travel positions; and placing said indicia graduation marks on a plate in fixed relationship to said potentiometer and with respect to an indicator coupled to said wiper.

2. The method of claim 1 wherein said potentiometer is rotary operated and said measures of displacement of the wiper correspond to electrical angles.

3. A method of calibrating a rotary operated potentiometer having minimum and maximum resistance values corresponding to opposing end-of-travel positions of a wiper and selectable resistance values corresponding to said wiper being positioned at selected angular positions between said opposing end-of-travel positions, comprising the steps of:

measuring a maximum resistance of said potentiometer;

measuring a first resistance value at a first predetermined position of the wiper;

measuring a second resistance value at a second predetermined position of the wiper wherein a known electrical angle separates said first and second predetermined positions;

calculating a maximum electrical angle of said potentiometer from said measured maximum resistance value, said first and second measured resistance values and said known electrical angle;

calculating a spacing interval for separating a plurality of indicia graduation marks based on said measured maximum resistance, said calculated maximum electrical angle, said first measured resistance value, said first predetermined position of the wiper and a plurality of particular resistance values such that each said indicia graduation mark indicates one of said plurality of particular resistance values of said potentiometer;

and placing said indicia graduation marks on a plate, said plate being in fixed relationship with a known location on said potentiometer such that an indicator in fixed relationship with a known location on a control shaft in fixed relationship with the wiper points to said indicia graduation marks as said control shaft is rotated and thereby provides a calibrated indication of the resistance of said potentiometer.

4. The method of claim 3 wherein said potentiometer is linearly operated and said electrical angles correspond to a measure of displacement of the wiper.

5. A method of uniquely calibrating an output of an electrical device wherein that output is controlled by a potentiometer having minimum and maximum output values corresponding to opposing end-of-travel positions of a wiper and selectable output values corresponding to the wiper being positioned at selected positions between said opposing end-of-travel positions by a control shaft coupled to the wiper, comprising the steps of:

electrically connecting a measuring device at test points such that an output value of the electrical device can be measured;

measuring a maximum output value of the electrical device;

measuring a first output value of the electrical device when the wiper is at a first predetermined position;

measuring a second output value of the electrical device when the wiper is at a second predetermined position wherein a known measure of displacement separates said first and second predetermined positions;

calculating a maximum displacement of the potentiometer based on said measured maximum output value of the electrical device, said second measured output value of the electrical device and said known measure of displacement;

calculating a spacing interval for separating a plurality of indicia graduation marks based on said measured maximum output of the electrical device, said calculated maximum displacement of the potentiometer, said first measured output value, said first predetermined position of the wiper and a plurality of particular measured output values of the electrical device such that each said indicia graduation mark indicates one of said plurality of particular measured output values of said electrical device; and placing said indicia graduation marks on a plate, said plate being in fixed relationship with a known location on said potentiometer such that an indicator in fixed relationship with a known location on said control shaft points to said indicia graduation marks as said control shaft is moved and thereby provides a calibrated indication of the output of said electrical device.

6. The method of claim 5 wherein said potentiometer is rotary operated and said measure of displacement of said wiper corresponds to an electrical angle.

7. A method of calibrating a potentiometer having minimum and maximum resistance values corresponding to opposing end-of-travel positions of a wiper and selectable resistance values corresponding to the wiper being positioned at selected positions between said opposing end-of-travel positions, comprising the steps of:

measuring the maximum resistance value of the potentiometer;

comparing said measured maximum resistance value with a plurality of preselected resistance ranges associated with said maximum resistance value;

assigning a range index number associated with that one of said plurality of preselected resistance ranges in which said measured maximum resistance value falls;

measuring a maximum displacement of the wiper between said opposing end-of-travel positions of the wiper;

comparing said measured maximum displacement with a plurality of preselected displacement ranges associated with said measured maximum displacement;

assigning a displacement index number associated with that one of said plurality of preselected displacement ranges in which said measured maximum displacement falls;

determining a range and a spacing interval for a plurality of indicia graduation marks based on said range and displacement index numbers, said indicia graduation marks indicating a calibrated resistance of said potentiometer with respect to a particular displacement off the wiper from one of said opposing end-of-travel positions; and placing said indicia graduation marks on a plate in fixed relationship to said potentiometer and with respect to an indicator coupled to the wiper.

8. The method of claim 7 wherein the potentiometer is rotary operated and said measure of displacement of the wiper corresponds to electrical angles.

9. A method of uniquely calibrating an individual potentiometer having minimum and maximum resistance values corresponding to opposing end-of-travel positions of a wiper and selectable resistance values corresponding to the wiper being selectively being positioned at selected positions between said opposing end-of-travel positions by a control shaft fixedly attached to the wiper, comprising the steps of:

electrically connecting a resistance measuring device between a selected one of said end-of-travel positions and the wiper such that a resistance value representative of the position of the wiper with respect to said selected end-of-travel position is displayed by the resistance measuring device;

placing a blank indicia plate in a fixture such that said indicia plate is in fixed relationship with a printing/marking device;

indexing said printing/marking device with the control shaft such that movement of the control shaft produces a like movement of said printing/marking device with respect to said indicia plate;

moving the control shaft such that the wiper is positioned at said selected end-of-travel position;

moving the control shaft such that the wiper moves away from said selected end-of-travel position;

stopping the control shaft when a desired resistance value is indicated on the measuring device;

activating the printing/marking device such that an indicia mark is placed on said indicia plate at a location corresponding to the wiper position when said desired resistance value is indicated on the measuring device;

repeating the steps of moving and stopping the control shaft and activating the printing/marking device until indicia marks have been placed on said indicia plate for all desired resistance values of the potentiometer; and locating said indicia plate immediately adjacent said control shaft and in fixed relationship to a known location on said potentiometer such that an indicator coupled to the control shaft can point at said indicia marks thereby indicating a particular one of said desired resistance values of said potentiometer at each of said indicia marks.

10. A method of uniquely calibrating an output of an electrical device wherein that output is controlled by a potentiometer having minimum and maximum output values corresponding to opposing end-of-travel positions of a wiper and selectable output values corresponding to said wiper being positioned at selected positions between said opposing end-of-travel positions, comprising the steps of:

electrically connecting a measuring device at test points such that an output value of the electrical device can be measured;

measuring a maximum output value of the electrical device;

measuring a first output value of the electrical device when said wiper is at a first predetermined position;

measuring a second output value of the electrical device when said wiper is at a second predetermined position wherein a known measure of displacement separates said first and second predetermined positions;

calculating a maximum displacement of said potentiometer based on said measured maximum output value of the electrical device, said second measured output value of the electrical device and said known measure of displacement;

comparing said measured maximum output value of the electrical device with a plurality of preselected output value ranges associated with said maximum output value of the electrical device;

assigning a range index number associated with that one of said plurality of preselected output value ranges in which said measured maximum output value falls;

comparing said calculated maximum displacement of said potentiometer with a plurality of preselected displacement ranges associated with said calculated maximum displacement of said potentiometer;

assigning a displacement index number associated with that one of said plurality of preselected displacement ranges in which said calculated maximum displacement falls;

determining a range and a spacing interval for a plurality of indicia graduation marks based on said range and displacement index numbers, each said indicia graduation mark indicating a particular calibrated output value of the electrical device with respect to a particular displacement of said wiper from one of said opposing end of travel positions; and placing said indicia graduation marks on a plate in fixed relationship with a known point of said potentiometer such that an indicator coupled to and in fixed relationship with said wiper of said potentiometer can indicate a calibrated output value of the electrical device by pointing to one of said indicia graduation marks.

11. The method of claim 10 wherein said potentiometer is rotary operated and said measure of displacement of said wiper corresponds to an electrical angle.

12. A method of uniquely calibrating an output of an electrical device wherein that output is controlled by a potentiometer having minimum and maximum output values corresponding to opposing end-of-travel positions of a wiper and selectable output values corresponding to said wiper being positioned at selected positions between said opposing end-of-travel positions, comprising the steps of:

electrically connecting a measuring device at a test point such that an output value of the electrical device can be measured;

measuring a maximum output value of the electrical device;

measuring a maximum displacement of said wiper of said potentiometer between said opposing end-of-travel positions;

comparing said measured maximum output value of the electrical device with a plurality of preselected output value ranges associated with said maximum output value of the electrical device;

assigning a range index number associated with that one of said plurality of preselected output value ranges in which said measured maximum output value falls;

comparing said measured maximum displacement of said wiper with a plurality of preselected displacement ranges associated with said measured maximum displacement of said wiper;

assigning a displacement index number associated with that one of said plurality of preselected displacement ranges in which said measured maximum displacement falls;

determining a range and a spacing interval for a plurality of indicia graduation marks based on said range and displacement index numbers, each said indicia graduation mark indicating a particular calibrated output value of the electrical device with respect to a particular displacement of said wiper from one of said opposing end of travel positions; and placing said indicia graduation marks on a plate in fixed relationship with a known point of said potentiometer such that an indicator coupled to and in fixed relationship with said wiper of said potentiometer can indicate a calibrated output value of the electrical device by pointing to one of said indicia graduation marks.

13. The method of claim 12 wherein said potentiometer is rotary operated and said measure of displacement of said wiper corresponds to an electrical angle.

14. A method of uniquely calibrating an output of an electrical device wherein that output is controlled by a potentiometer having minimum and maximum output values corresponding to opposing end-of-travel positions of a wiper and selectable output values corresponding to the wiper being positioned at selected positions between said opposing end-of-travel positions by a control shaft coupled to the wiper, comprising the steps of:

electrically connecting an output measuring device at test points such that an output value of the electrical device can be displayed by the output measuring device;

placing a blank indicia plate in a fixture such that said indicia plate is in fixed relationship with a printing/marking device;

indexing said printing/marking device with the control shaft such that movement of the control shaft produces a like movement of said printing/marking device with respect to said indicia plate;

moving the control shaft such that the wiper is positioned at said selected end-of-travel position;

moving the control shaft such that the wiper moves away from said selected end-of-travel position;

stopping the control shaft when a desired output value is indicated on the output measuring device;

activating the printing/marking device such that an indicia mark is placed on said indicia plate at a location corresponding to the wiper position when said desired output value is indicated on the output measuring device;

repeating the steps of moving and stopping the control shaft and activating the printing/marking device until indicia marks have been placed on the indicia plate for all desired output values of the electrical device, and locating said indicia plate immediately adjacent the control shaft and in fixed relationship to a known location on said potentiometer such that an indicator connected to the control shaft can point at said indicia marks thereby indicating a particular one of said desired output values of said electrical device at each said indicia mark.

* * * * *